United States Patent
Tseng et al.

(10) Patent No.: US 11,310,454 B2
(45) Date of Patent: Apr. 19, 2022

(54) PIXEL CIRCUIT AND IMAGE SENSOR HAVING THE SAME

(71) Applicant: SHENZHEN GOODIX TECHNOLOGY CO., LTD., Guangdong (CN)

(72) Inventors: Chien-Jian Tseng, Guangdong (CN); Wei-Min Chao, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 208 days.

(21) Appl. No.: 16/706,374

(22) Filed: Dec. 6, 2019

(65) Prior Publication Data
US 2020/0162690 A1    May 21, 2020

Related U.S. Application Data

(63) Continuation of application No. PCT/CN2018/116318, filed on Nov. 20, 2018.

(51) Int. Cl.
 H04N 5/378    (2011.01)
 H01L 27/146   (2006.01)
 H04N 5/3745   (2011.01)

(52) U.S. Cl.
 CPC ....... *H04N 5/378* (2013.01); *H01L 27/14645* (2013.01); *H04N 5/3745* (2013.01)

(58) Field of Classification Search
 CPC .. H04N 5/378; H04N 5/3745; H04N 5/37457; H04N 5/369; H01L 27/14645; H01L 27/14601; H01L 27/14643
 See application file for complete search history.

(56) References Cited

U.S. PATENT DOCUMENTS

| 6,130,423 A | 10/2000 | Brehmer et al. |
| 6,717,616 B1 | 4/2004 | Afghahi et al. |

(Continued)

FOREIGN PATENT DOCUMENTS

| CN | 1697480 A | 11/2005 |
| CN | 101266751 A | 9/2008 |

(Continued)

OTHER PUBLICATIONS

Niclass, C., Favi, C., Kluter, T., Gersbach, M., & Charbon, E. (2008). A 128×128 Single-Photon Image Sensor With Column-Level 10-Bit Time-to-Digital Converter Array. IEEE Journal of Solid-State Circuits, 43(12), 2977-2989. doi:10.1109/jssc.2008.2006445.

(Continued)

*Primary Examiner* — Tony Ko
(74) *Attorney, Agent, or Firm* — WPAT, P.C., Intellectual Property Attorneys; Anthony King

(57) ABSTRACT

Provided are a pixel circuit and an associated image sensor, including an inverting input circuit, an active load and a signal reading circuit. Each pixel circuit includes a light sensing component, a transmission switch, a reset switch and a unity gain buffer. The transmission switch is series-connected between the light sensing component and the transmission switch. The unity gain buffer is connected to a node of connection of the transmission switch and the reset switch. The signal read circuit reads a sensing signal of the light sensing component through the unity gain buffer. An output signal of the unity gain buffer varies with an input signal of the unity gain buffer, attaining a linear relationship between the output signal and the input signal. Therefore, the photoelectric conversion curve of each pixel circuit is linear.

20 Claims, 4 Drawing Sheets

(56) References Cited

U.S. PATENT DOCUMENTS

| | | |
|---|---|---|
| 9,609,249 B2* | 3/2017 | Anjyou ................ H04N 5/3742 |
| 2007/0177043 A1 | 8/2007 | Kok |
| 2017/0272674 A1 | 9/2017 | Tokunaga |

FOREIGN PATENT DOCUMENTS

| | | |
|---|---|---|
| CN | 102387320 A | 3/2012 |
| CN | 104869330 A | 8/2015 |
| GB | 2351867 A | 1/2001 |
| WO | WO2012119327 A1 | 9/2012 |

OTHER PUBLICATIONS

International Search Report ISA-210 for PCT/CN2018/116318.
Notification of Transmittal of the International Search Report and the Written Opinion of the International Searching Authority, or the Declaration ISA-220 for PCT/CN2018/116318.
Written Opinion of the International Searching Authority ISA-237 for PCT/CN2018/116318.
English Abstract Translation of Foreign Reference CN1697480A.
English Abstract Translation of Foreign Reference CN102387320A.
PCT request form for PCT/CN2018/116318.
PCT application as filed for PCT/CN2018/116318.
English Abstract Translation of Foreign Reference CN101266751A.
English Abstract Translation of Foreign Reference CN104869330A.

* cited by examiner

PIXEL CIRCUIT AND IMAGE SENSOR HAVING THE SAME

CROSS-REFERENCE TO RELATED APPLICATIONS

This application is a continuation of International Application No. PCT/CN2018/116318, filed on Nov. 20, 2018, the disclosure of which is hereby incorporated by reference in its entirety.

TECHNICAL FIELD

The present application relates to pixel circuits and, more particularly, to a pixel circuit with better linearity and an associated image sensor.

BACKGROUND

An image sensor consists of pixel circuits. For instance, a pixel circuit of a 4T-CIS (COMS image sensor) includes a light sensing component and four transistors. The four transistors, which differ in function, serve as a transmission switch, a reset switch, a source follower, and a selection switch, respectively, to transmit a sensing signal generated by exposure of the light sensing component.

Owing to the body effect of the source follower, the 4T-CIS pixel circuit manifests a photoelectric conversion curve which is non-linear. To obtain a photoelectric conversion curve with better linearity, it is necessary to improve pixel circuits of image sensors.

SUMMARY OF THE INVENTION

One of the objectives of the present application is to provide a pixel circuit and an associated image sensor to solve the aforementioned issues.

An embodiment of the present application provides a pixel circuit. The pixel circuit comprises a light sensing component, a reset switch, a transmission switch and a unity gain buffer. The transmission switch is series-connected between the light sensing component and the reset switch. The transmission switch is series-connected between the light sensing component and the transmission switch. The unity gain buffer comprises a non-inverting input circuit, an inverting input circuit, and an active load. The non-inverting input circuit comprises a non-inverting input terminal connected to a node of connection of the transmission switch and the reset switch. The inverting input circuit comprises an inverting input terminal. The active load comprises an output terminal connected to the inverting input terminal. The active load is connected to the non-inverting input circuit and the inverting input circuit.

The pixel circuit of the present application is advantageous in that the unity gain buffer is connected to a node of connection of the transmission switch and the reset switch. An output signal of the unity gain buffer varies with an input signal of the unity gain buffer, attaining a linear relationship between the output signal and the input signal. Therefore, the photoelectric conversion curve of each pixel circuit is linear.

An embodiment of the present application provides an image sensor. The image sensor comprises a plurality of pixel circuits, an inverting input circuit and active load. Each pixel circuit comprises a light sensing component, a transmission switch, a reset switch, and a non-inverting input circuit. The non-inverting input circuit comprises a non-inverting input terminal connected to a node of connection of the transmission switch and the reset switch. The inverting input circuit comprises an inverting input terminal. The active load comprises an output terminal connected to the inverting input terminal. The active load is connected to the inverting input circuit and the non-inverting input circuit of each pixel circuit. The pixel circuits share the inverting input circuit and the active load.

One of the pixel circuits of the image sensor of the present application is selected. The non-inverting input circuit and the active load of the selected pixel circuit together form a unity gain buffer through the inverting input circuit and are connected to a node of connection of the transmission switch and the reset switch. An output signal of the unity gain buffer varies with an input signal of the unity gain buffer, attaining a linear relationship between the output signal and the input signal. Therefore, the photoelectric conversion curve of each pixel circuit is linear.

DETAILED DESCRIPTION OF THE EMBODIMENTS

Specific components disclosed in the specification and claims are referred to by technical terms. Persons skilled in the art understand that manufacturers might refer to the specific components by some other technical terms. In the specification and claims, the disclosed components are distinguished from each other by function rather than by name. The verbs "comprise(s)" and "comprising" used in the specification and claims are an open-ended expression and therefore must be interpreted to mean "include(s), but are/is not limited to" and "including, but not limited to", respectively.

The present application provides a pixel circuit and an associated image sensor having the pixel circuit. When each pixel circuit of the image sensor is operating, linear characteristics of the unity gain buffer are conducive to improvement of linearity of the photoelectric conversion curve of the pixel circuit. The pixel circuit and the associated image sensor having the same are illustrated by embodiments and diagrams and described below.

Figure 1A:
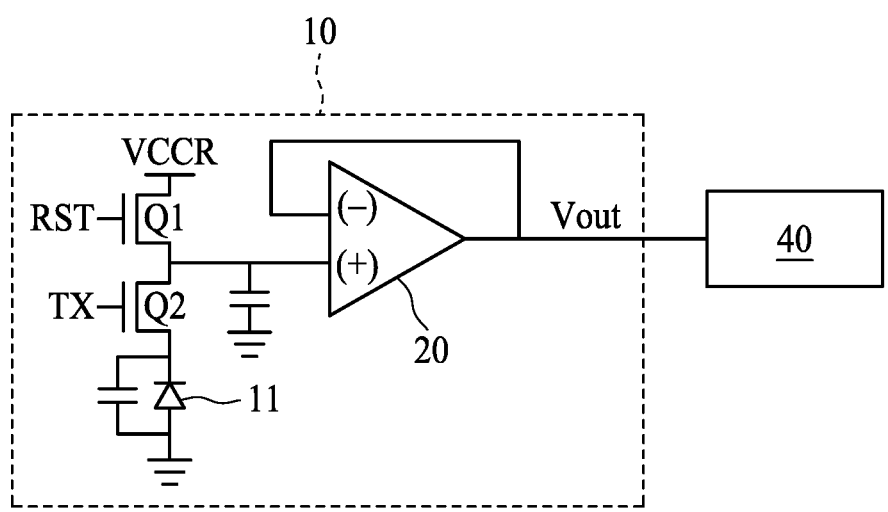
FIG. 1A is an equivalent circuit diagram of a pixel circuit of the present application.

Referring to FIG. 1A, the present application provides a pixel circuit 10 connected to a signal reading circuit 40, and the signal reading circuit 40 reads a sensing signal of the pixel circuit 10.

The pixel circuit 10 comprises a light sensing component 11, a reset switch Q1, a transmission switch Q2 and a unity gain buffer 20. The reset switch Q1 and transmission switch Q2 are transistors. In this embodiment, both the reset switch Q1 and transmission switch Q2 are NMOS transistors. The reset switch Q1 has a drain connected to a first reference voltage VCCR, a gate connected to a reset signal, and a source connected to the drain of transmission switch Q2. The transmission switch Q2 has a gate connected to a transmission signal and a source connected to the negative terminal of the light sensing component 11, wherein the positive terminal of the light sensing component 11 is connected to a ground voltage. In this embodiment, the light sensing component 11 is a photoelectric diode.

The unity gain buffer 20 has an inverting input terminal (−), a non-inverting input terminal (+) and an output terminal Vout. The non-inverting input terminal (+) is connected to a node of connection of the reset switch Q1 and the transmission switch Q2. The inverting input terminal (−) of the unity gain buffer 20 is connected to the output terminal Vout, and the output terminal Vout is connected to the signal reading circuit 40.

Figure 1B:
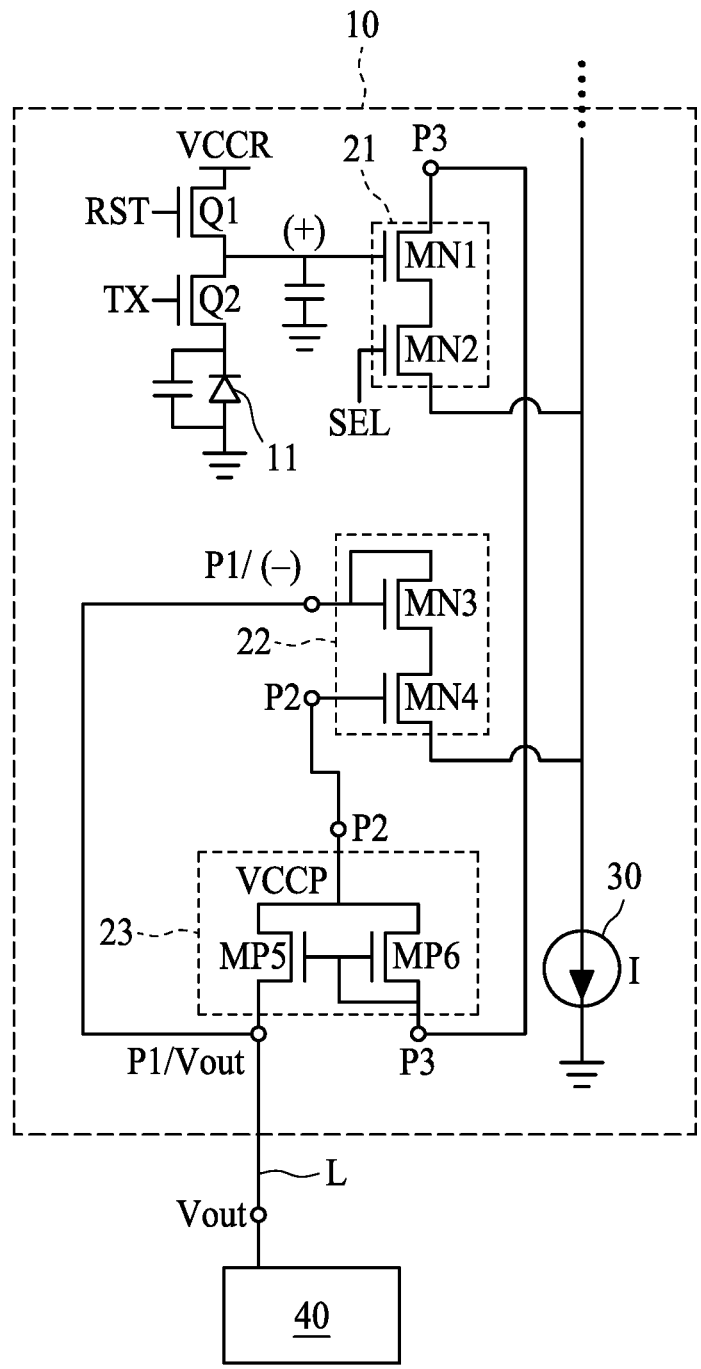
FIG. 1B is a circuit diagram based on FIG. 1A.

Referring to FIG. 1B, in this embodiment, the unity gain buffer 20 comprises a non-inverting input circuit 21, an inverting input circuit 22, an active load 23 and a current source 30. The non-inverting input circuit 21 comprises the non-inverting input terminal (+); hence, the non-inverting input circuit 21 is connected to a node of connection of transmission switch Q2 and reset switch Q1 through the non-inverting input terminal (+). The non-inverting input circuit 21 is connected to the active load 23. The inverting input circuit 22 comprises the inverting input terminal (−). The active load 23 comprises the output terminal Vout. Therefore, the inverting input terminal (−) of the inverting input circuit 22 is connected to the output terminal Vout of the active load 23. The current source 30 is connected to the non-inverting input circuit 21 and the inverting input circuit 22 so as to provide current I.

In this embodiment, the non-inverting input circuit 21 comprises first transistor MN1 and second transistor MN2, wherein both first transistor MN1 and second transistor MN2 are NMOS transistors. The gate of first transistor MN1 is connected to a node of connection of transmission switch Q2 and reset switch Q1 through the non-inverting input terminal (+). The drain of first transistor MN1 is connected to the active load 23. The source of first transistor MN1 is connected to the drain of second transistor MN2. The gate of second transistor MN2 is connected to a selection signal. The source of second transistor MN2 is connected to the current source 30.

In this embodiment, the inverting input circuit 22 comprises third transistor MN3 and fourth transistor MN4, wherein both third transistor MN3 and fourth transistor MN4 are NMOS transistors. The drain and gate of third transistor MN3 are jointly connected to the output terminal Vout of the active load 23 through the inverting input terminal (−). The source of third transistor MN3 is connected to the drain of fourth transistor MN4. The gate of fourth transistor MN4 is connected to the active load 23. The source of fourth transistor MN4 is connected to the current source 30. The third transistor MN3 and first transistor MN1 have substantially identical ion implantation so as to generate substantially identical threshold voltage, whereas the fourth transistor MN4 and second transistor MN2 have substantially identical ion implantation so as to generate substantially identical threshold voltage, so as to match the non-inverting input terminal (+) and the inverting input terminal (−) to a greater extent.

In this embodiment, the active load 23 comprises fifth transistor MP5 and sixth transistor MP6, wherein both fifth transistor MP5 and sixth transistor MP6 are PMOS transistors. The gate of fifth transistor MP5 is connected to the gate of sixth transistor MP6. The sources of fifth transistor MP5 and sixth transistor MP6 are jointly connected to the gate of fourth transistor MN4 of the inverting input circuit 22. The drain of fifth transistor MP5 is connected to the output terminal Vout. The drain of sixth transistor MP6 is connected to the gate of sixth transistor MP6 and connected to the drain of first transistor MN1 of the non-inverting input circuit 21.

Figure 2:
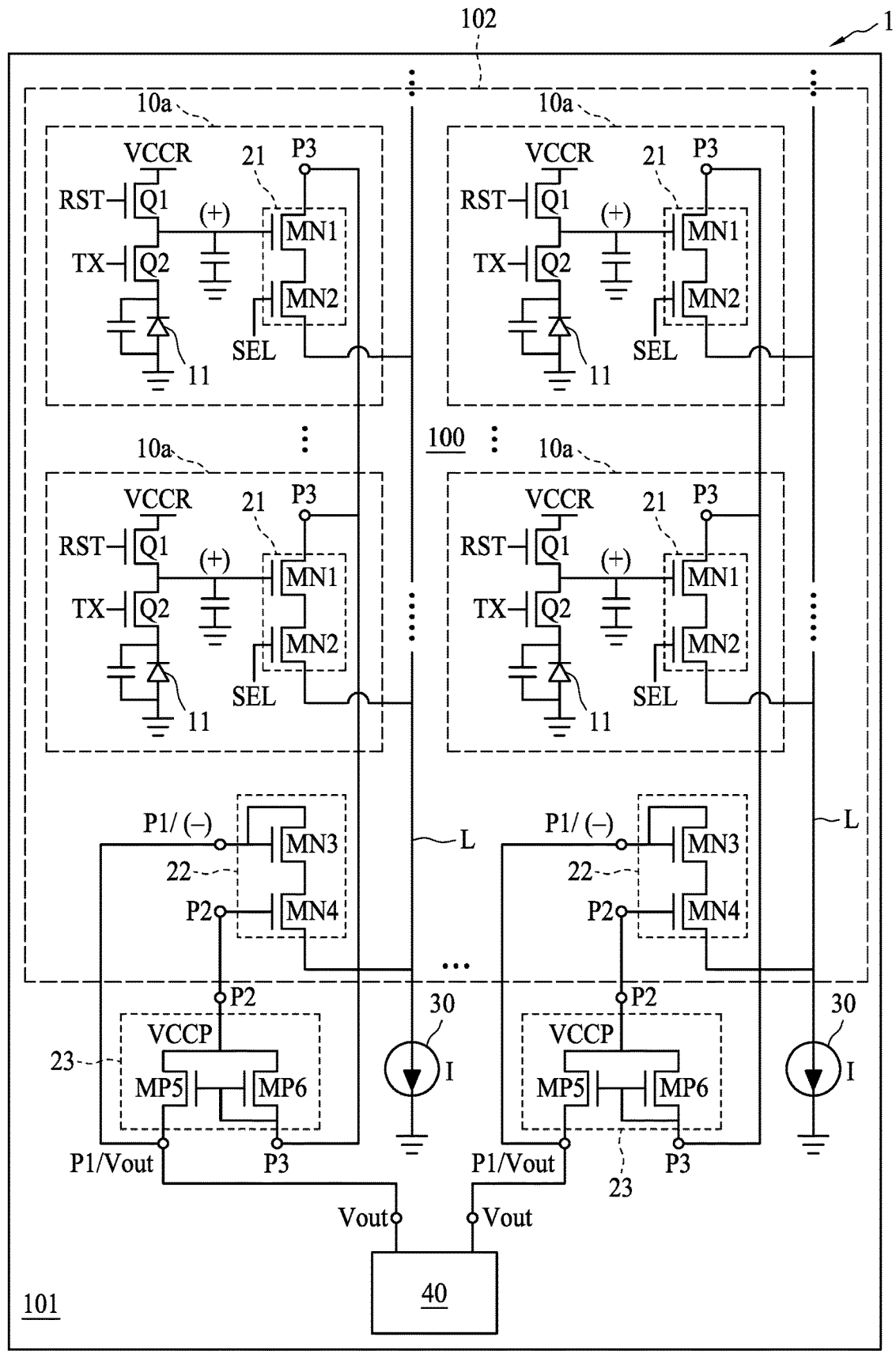
FIG. 2 is a circuit diagram of an image sensor according to the first embodiment of the present application.

Referring to FIG. 2, the first embodiment of the present application provides an image sensor 1 which comprises a plurality of pixel circuits 10a arranged in a matrix. The pixel circuits 10a in each column each comprise a light sensing component 11, a reset switch Q1, a transmission switch Q2 and a non-inverting input circuit 21. In this embodiment, the pixel circuits 10a in each column share the inverting input circuit 22, the active load 23, and the current source 30. When each of the pixel circuits 10a is operating (i.e., when selected by the signal reading circuit 40), the non-inverting input circuit 21 of each of the pixel circuits 10a, the inverting input circuit 22, the active load 23 and the current source 30 equivalently form the unity gain buffer 20.

The reset switch Q1 is connected to the first reference voltage VCCR. The transmission switch Q2 is series-connected between the light sensing component 11 and reset switch Q1. The non-inverting input circuit 21 comprises a non-inverting input terminal (+) connected to a node of connection of transmission switch Q2 and reset switch Q1. The non-inverting input circuit 21 in FIG. 2 is the same as the non-inverting input circuit 21 in FIG. 1B and therefore is, for the sake of brevity, not described hereunder.

The inverting input circuit 22 comprises an inverting input terminal (−) and is the same as the inverting input circuit 22 in FIG. 1B and therefore is, for the sake of brevity, not described hereunder. The active load 23 comprises the output terminal Vout. The output terminal Vout is connected to the inverting input terminal (−). The active load 23 is connected to the inverting input circuit 22 and the non-inverting input circuit 21 of each of the pixel circuits 10a. The pixel circuits 10a share the inverting input circuit 22 and the active load 23. The active load 23 has the same circuit as the active load 23 in FIG. 1B and therefore is, for the sake of brevity, not described hereunder. The signal reading circuit 40 is connected to the output terminal Vout of the active load 23 to read the sensing result of the light sensing component 11 of each of the pixel circuits 10a.

In this embodiment, the image sensor 1 comprises a pixel region 100 and a peripheral region 101 defined at the periphery of the pixel region 100. The pixel region 100 is surrounded by a pixel region guard ring 102. The first transistor MN1 and second transistor MN2 of the non-inverting input circuit 21 and the third transistor MN3 and fourth transistor MN4 of the inverting input circuit 22 are disposed in the pixel region 100 within the pixel region guard ring 102 and undergo the same semiconductor manufacturing process, for example, a doping process, as the transistors, such as reset switch Q1 and transmission switch Q2, within the pixel region guard ring 102, so as to match the non-inverting input circuit 21 and the inverting input circuit 22 to a greater extent. The third transistor MN3 and first transistor MN1 have substantially identical ion implantation so as to generate substantially identical threshold voltage, whereas the fourth transistor MN4 and second transistor MN2 have substantially identical ion implantation so as to generate substantially identical threshold voltage, thereby matching the non-inverting input terminal (+) and the inverting input terminal (−) to a greater extent. The fifth transistor MP5 and sixth transistor MP6 of the active load 23 and the signal reading circuit 40 are disposed in the peripheral region 101 outside the pixel region guard ring 102.

In this embodiment of the present application, both first transistor MN1 and second transistor MN2 still have a source follower and a selection switch of each of the pixel circuits 10a and are joined by the third through sixth transistors MN3~MP6 to form the unity gain buffer 20. An output signal of the unity gain buffer 20 varies with an input signal of the unity gain buffer 20, attaining a linear relationship between the output signal and the input signal. Therefore, the photoelectric conversion curve of each of the pixel circuits 10a is linear.

Figure 3:
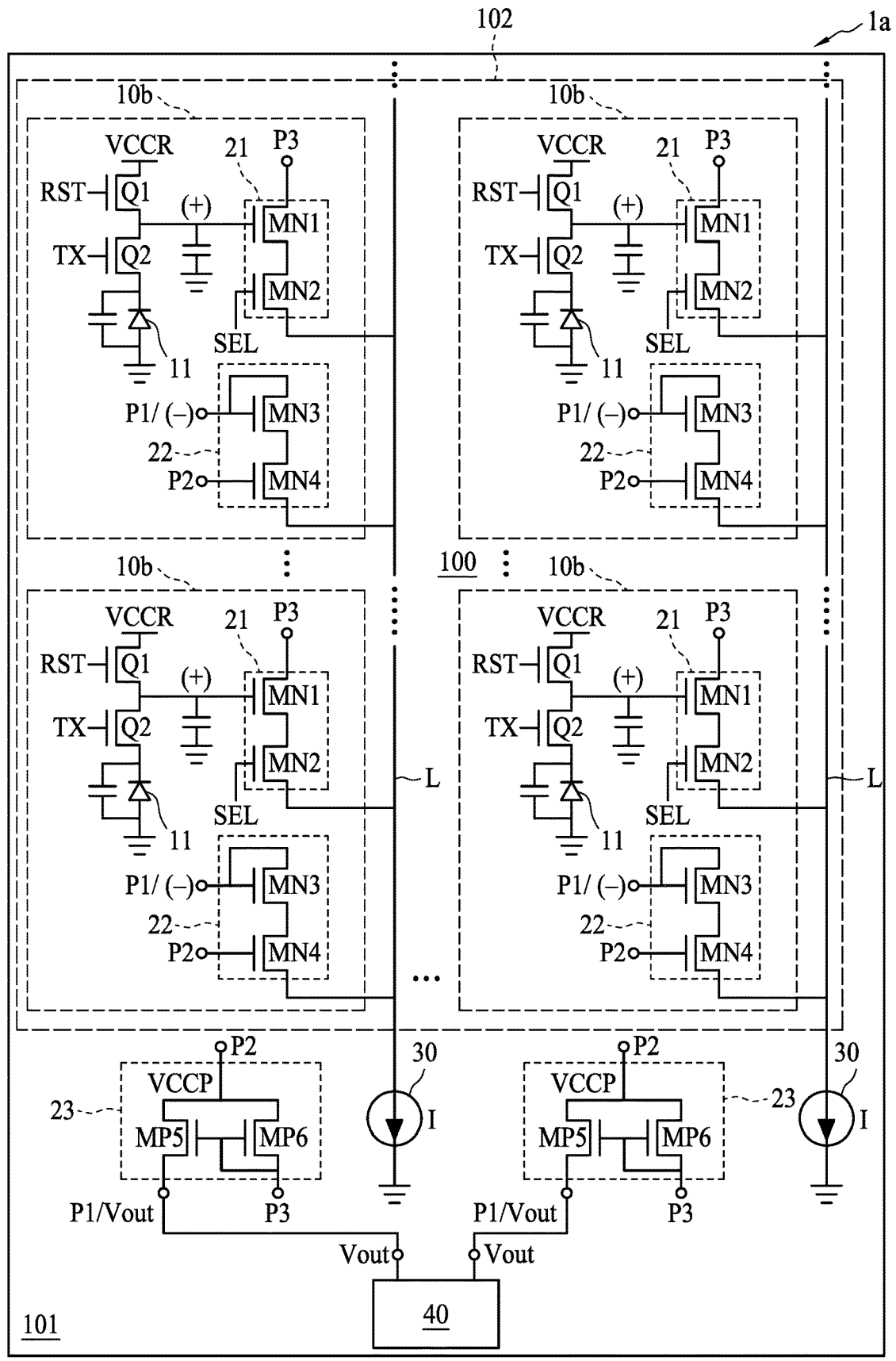
FIG. 3 is a circuit diagram of the image sensor according to the second embodiment of the present application.

Referring to FIG. 3, the second embodiment of the present application provides the image sensor 1a which comprises pixel circuits 10b arranged in a matrix. The pixel circuits 10b in each column each comprise a light sensing component 11, a reset switch Q1, a transmission switch Q2 and a non-inverting input circuit 21. Unlike the image sensor 1 in the first embodiment illustrated by FIG. 2, the image sensor 1a in the second embodiment illustrated by FIG. 3 includes the inverting input circuit 22 in each pixel circuit 10b. In this embodiment, the pixel circuits 10b in each column share the active load 23 and the current source 30. When each pixel circuit 10b is operating (i.e., when selected by the signal reading circuit 40), the inverting input circuit 22 and the non-inverting input circuit 21 of each pixel circuit 10b together with the active load 23 and the current source 30 equivalently form the unity gain buffer 20.

Like the embodiment illustrated by FIG. 2, the embodiment illustrated by FIG. 3 is characterized in that the image sensor 1 comprises the pixel region 100 surrounded by the pixel region guard ring 102 and the peripheral region 101 defined at the periphery of the pixel region 100. The first transistor MN1 and second transistor MN2 of the non-inverting input circuit 21 of each pixel circuit 10a and the third transistor MN3 and fourth transistor MN4 of the inverting input circuit 22 of each pixel circuit 10b are disposed in the pixel region 100 within the pixel region guard ring 102 and undergo the same semiconductor manufacturing process, for example, a doping process, as the transistors, such as reset switch Q1 and transmission switch Q2, within the pixel region guard ring 102, so as to match the non-inverting input circuit 21 and the inverting input circuit 22 to a greater extent. The third transistor MN3 and first transistor MN1 have substantially identical ion implantation so as to generate substantially identical threshold voltage, whereas the fourth transistor MN4 and second transistor MN2 have substantially identical ion implantation so as to generate substantially identical threshold voltage, thereby matching the non-inverting input terminal (+) and the inverting input terminal (−) to a greater extent. The fifth transistor MP5 and sixth transistor MP6 of the active load 23 and the signal reading circuit 40 are disposed in the peripheral region 101 outside the pixel region guard ring 102.

In conclusion, each pixel circuit of the image sensor of the present application is connected to a node of connection of the transmission switch and the reset switch through the unity gain buffer. An output signal of the unity gain buffer varies with an input signal of the unity gain buffer, attaining a linear relationship between the output signal and the input signal. Therefore, the photoelectric conversion curve of each pixel circuit is linear.

Although the present application is disclosed above by preferred embodiments, the preferred embodiments are not restrictive of the present application. Changes and variations can be made by persons skilled in the art to the preferred embodiments of the present application. All changes, equivalent replacements, and improvements made to the preferred embodiments of the present application without departing from the spirit and principles of the present application must be deemed falling within the scope of the present application.

What is claimed is:

1. A pixel circuit, characterized by comprising:
    a light sensing component;
    a reset switch connected to a first reference voltage;
    a transmission switch series-connected between the light sensing component and the reset switch; and
    a unity gain buffer comprising:
        a non-inverting input circuit comprising a non-inverting input terminal connected to a node of connection of the transmission switch and the reset switch;
        an inverting input circuit comprising an inverting input terminal; and
        an active load comprising an output terminal connected to the inverting input terminal, the active load being connected to the non-inverting input circuit and the inverting input circuit.

2. The pixel circuit of claim 1, wherein the unity gain buffer further comprises a current source for providing current to the unity gain buffer.

3. The pixel circuit of claim 2, wherein the non-inverting input circuit comprises:
    a first transistor with a gate connected to the non-inverting input terminal and a drain connected to the active load; and
    a second transistor with a gate connected to a selection signal, a drain connected to a source of the first transistor, and a source connected to the current source.

4. The pixel circuit of claim 3, wherein the inverting input circuit comprises:
    a third transistor, wherein a gate and a drain of the third transistor are jointly connected to the inverting input terminal, wherein the third transistor and the first transistor have substantially identical ion implantation so as to generate substantially identical threshold voltage; and
    a fourth transistor with a gate connected to the active load, a drain connected to a source of the third transistor, and a source connected to the current source, wherein the fourth transistor and the second transistor have substantially identical ion implantation so as to generate substantially identical threshold voltage.

5. The pixel circuit of claim 4, wherein the active load comprises:
    a fifth transistor; and
    a sixth transistor;
    wherein a gate of the fifth transistor is connected to a gate of the sixth transistor, sources of the fifth transistor and the sixth transistor are jointly connected to the gate of the fourth transistor of the inverting input circuit, a drain of the fifth transistor is connected to the output terminal, and a drain of the sixth transistor is connected to gate of the sixth transistor and connected to the drain of the first transistor of the non-inverting input circuit.

6. The pixel circuit of claim 5, wherein the first through fourth transistors are NMOS transistors, whereas the fifth and sixth transistors are PMOS transistors, and the light sensing component in each of the pixel circuits is a photoelectric diode.

7. An image sensor, comprising:
    a plurality of pixel circuits each comprising:
        a light sensing component;
        a reset switch connected to a first reference voltage;
        a transmission switch series-connected between the light sensing component and the reset switch; and
        a non-inverting input circuit comprising a non-inverting input terminal connected to a node of connection of the transmission switch and the reset switch;
    an inverting input circuit comprising an inverting input terminal; and an active load comprising an output terminal connected to the inverting input terminal, the active load being connected to the inverting input circuit and the non-inverting input circuit of each of the pixel circuits, wherein the pixel circuits in each column share the inverting input circuit and the active load.

8. The image sensor of claim 7, further comprising:
a signal reading circuit connected to an output terminal of the active load to read a sensing result of the light sensing component of each of the pixel circuits.

9. The image sensor of claim 8, further comprising a pixel region guard ring for surrounding therein the pixel circuits and the inverting input circuit.

10. The image sensor of claim 8, further comprising:
a current source connected to the inverting input circuit and the non-inverting input circuit of each of the pixel circuits, wherein, when the signal reading circuit selects one of the pixel circuits, the non-inverting input circuit of the selected pixel circuit, the inverting input circuit, the active load and the current source equivalently form a unity gain buffer.

11. The image sensor of claim 10, wherein the non-inverting input circuit of each of the pixel circuits comprises:
a first transistor with a gate connected to the non-inverting input terminal and a drain connected to the active load; and
a second transistor with a gate connected to a selection signal, a drain connected to a source of the first transistor, and a source connected to the current source.

12. The image sensor of claim 11, wherein the inverting input circuit comprises:
a third transistor, wherein a gate and a drain of the third transistor are jointly connected to the inverting input terminal, wherein the third transistor and the first transistor have substantially identical ion implantation so as to generate substantially identical threshold voltage; and
a fourth transistor with a gate connected to the active load, a drain connected to a source of the third transistor, and a source connected to the current source, wherein the fourth transistor and the second transistor have substantially identical ion implantation so as to generate substantially identical threshold voltage.

13. The image sensor of claim 12, wherein the active load comprises:
a fifth transistor; and
a sixth transistor;
wherein a gate of the fifth transistor is connected to a gate of the sixth transistor, sources of the fifth transistor and the sixth transistor are jointly connected to the gate of the fourth transistor of the inverting input circuit, a drain of the fifth transistor is connected to the output terminal, and a drain of the sixth transistor is connected to a gate of the sixth transistor and connected to the drain of the first transistor of the non-inverting input circuit of each of the pixel circuit.

14. An image sensor, comprising:
a plurality of pixel circuits each comprising:
a light sensing component;
a reset switch connected to a first reference voltage;
a transmission switch series-connected between the light sensing component and the reset switch;
a non-inverting input circuit comprising a non-inverting input terminal connected to a node of connection of the transmission switch and the reset switch; and
an inverting input circuit comprising an inverting input terminal; and
an active load comprising an output terminal connected to the inverting input terminal, the active load being connected to the inverting input circuit of each of the pixel circuits and the non-inverting input circuit of each of the pixel circuits, wherein the pixel circuits in each column share the active load.

15. The image sensor of claim 14, further comprising:
a signal reading circuit connected to an output terminal of the active load to read a sensing result of the light sensing component of each of the pixel circuits.

16. The image sensor of claim 15, further comprising a pixel region guard ring for surrounding therein the pixel circuits.

17. The image sensor of claim 15, further comprising:
a current source connected to the inverting input circuit of each of the pixel circuits and the non-inverting input circuit of each of the pixel circuits, wherein, when the signal reading circuit selects one of the pixel circuits, the non-inverting input circuit of the selected pixel circuit, the inverting input circuit of the selected pixel circuit, the active load and the current source equivalently form a unity gain buffer.

18. The image sensor of claim 17, wherein the non-inverting input circuit of each of the pixel circuits comprises:
a first transistor with a gate connected to the non-inverting input terminal and a drain connected to the active load; and
a second transistor with a gate connected to a selection signal, a drain connected to a source of the first transistor, and a source connected to the current source.

19. The image sensor of claim 17, wherein the inverting input circuit of each of the pixel circuits comprises:
a third transistor, wherein a gate and a drain of the third transistor are jointly connected to the inverting input terminal, wherein the third transistor and the first transistor have substantially identical ion implantation so as to generate substantially identical threshold voltage; and
a fourth transistor with a gate connected to the active load, a drain connected to a source of the third transistor, and a source connected to the current source, wherein the fourth transistor and the second transistor have substantially identical ion implantation so as to generate substantially identical threshold voltage.

20. The image sensor of claim 17, wherein the active load comprises:
a fifth transistor; and
a sixth transistor;
wherein a gate of the fifth transistor is connected to a gate of the sixth transistor, sources of the fifth transistor and the sixth transistor are jointly connected to the gate of the fourth transistor of the inverting input circuit of each of the pixel circuits, a drain of the fifth transistor is connected to the output terminal, and a drain of the sixth transistor is connected to a gate of the sixth transistor and connected to the drain of the first transistor of the non-inverting input circuit of each of the pixel circuit.

* * * * *